US005727031A

United States Patent [19]

Solve et al.

[11] Patent Number: 5,727,031
[45] Date of Patent: Mar. 10, 1998

[54] ADAPTIVE GAIN CONTROLLER

[75] Inventors: Torkel C.J. Solve, Bromma; Antoni Fertner, Solna, both of Sweden

[73] Assignee: Telefonaktiebolaget LM Ericsson, Stockholm, Sweden

[21] Appl. No.: 497,228

[22] Filed: Jun. 30, 1995

[51] Int. Cl.$^6$ .................. H04L 27/08; H04L 1/38
[52] U.S. Cl. .................. 375/345; 375/219
[58] Field of Search .................. 375/222, 317, 375/345, 316, 286, 219, 295; 455/234.1; 327/54

[56] References Cited

U.S. PATENT DOCUMENTS

| | | | |
|---|---|---|---|
| 3,562,504 | 2/1971 | Harris | 341/75 |
| 4,161,628 | 7/1979 | McRae | 370/17 |
| 4,207,523 | 6/1980 | Acker | 375/286 |
| 4,251,881 | 2/1981 | Ruether et al. | 370/98 |
| 4,623,934 | 11/1986 | Taylor | 375/222 |
| 4,625,240 | 11/1986 | Yablonski et al. | 375/345 |
| 4,683,578 | 7/1987 | Betts et al. | 375/345 |
| 4,829,593 | 5/1989 | Hara | 375/345 |
| 4,868,850 | 9/1989 | Kaku et al. | 375/231 |
| 4,972,430 | 11/1990 | Cantwell | 375/200 |
| 4,982,428 | 1/1991 | Agazzi et al. | 379/411 |
| 5,023,869 | 6/1991 | Grover et al. | 370/195 |
| 5,029,182 | 7/1991 | Cai et al. | 375/202 |
| 5,208,846 | 5/1993 | Hammond et al. | 379/29 |
| 5,233,634 | 8/1993 | Väisänen | 375/325 |
| 5,245,556 | 9/1993 | Morgan et al. | 364/602 |
| 5,295,178 | 3/1994 | Nickel et al. | 379/58 |
| 5,313,172 | 5/1994 | Vagher | 330/254 |
| 5,517,527 | 5/1996 | Yu | 375/233 |

FOREIGN PATENT DOCUMENTS

| | | |
|---|---|---|
| A 0511094 | 10/1992 | European Pat. Off. |
| A 2146191 | 4/1985 | United Kingdom. |

*Primary Examiner*—Tesfaldet Bocure
*Attorney, Agent, or Firm*—Nixon & Vanderhye P.C.

[57] ABSTRACT

The present invention provides accurate, unbiased adaptive gain control in high speed digital communications systems. The probability of receiving each of a plurality of symbols to be transmitted over a data communications channel is determined for the predetermined communications protocol used over that data communications channel. Based on the probability determined for each symbol, an adaptive gain control adjustment factor is established for each symbol. During active communications, symbols transmitted over the data communications channel are detected, and the adaptive gain control value is selectively adjusted using an adjustment factor established for the detected symbol. Accordingly, adaptive gain control updating in accordance with one embodiment of the invention employs different step sizes for incrementing and decrementing the adaptive gain control value depending on the magnitude of the symbol received.

30 Claims, 2 Drawing Sheets

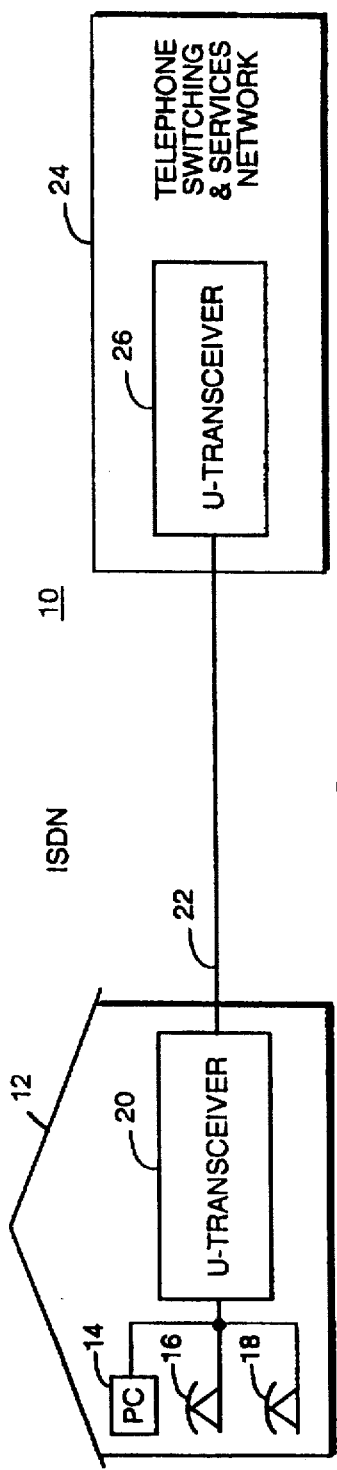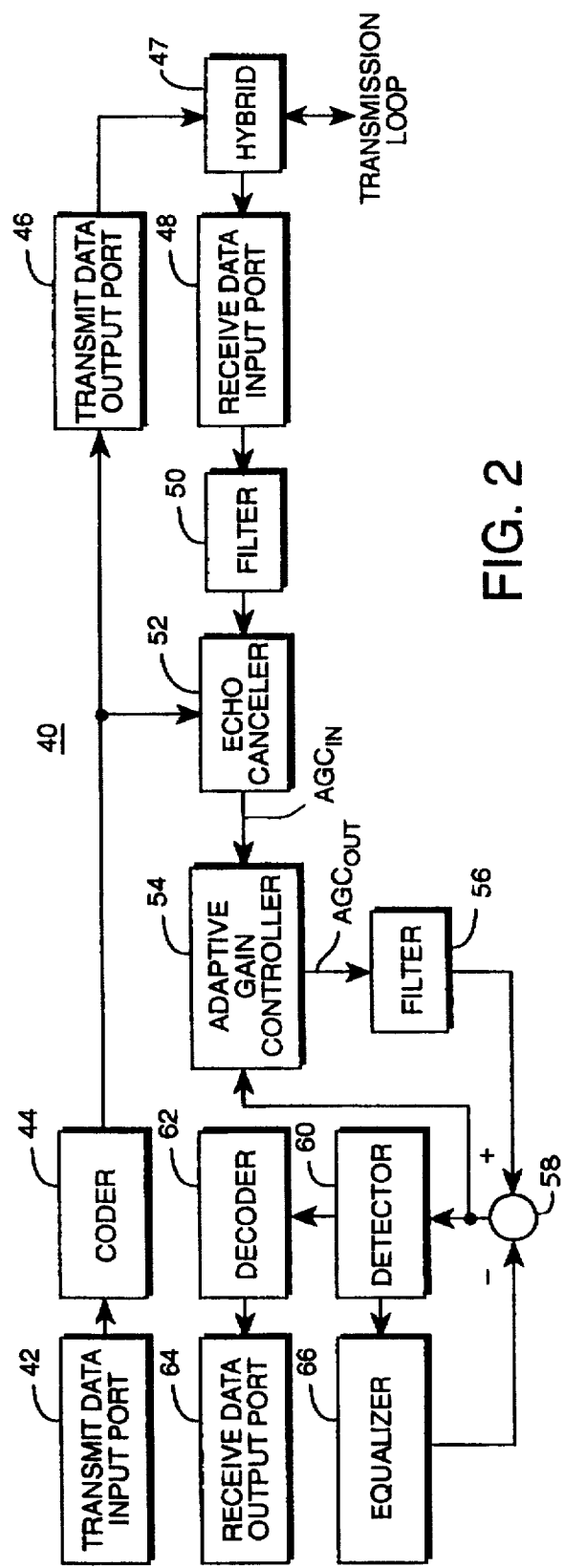

ADAPTIVE GAIN CONTROLLER

FIELD OF THE INVENTION

The present invention relates to data communications wherein data symbols are transmitted over a communications channel, and in particular, to an adaptive gain control method and apparatus for adaptively adjusting the amplitude of received symbols.

BACKGROUND OF THE INVENTION

Telecommunications systems, such as the integrated data services digital network (ISDN), transmit information over existing telephone lines in coded format. One of several different distal line codes each with a particular symbol distribution may be used to code the binary information. In its simplest form, line coding uses a different signal level to encode each discrete symbol transmitted. While a common form of coding in computer systems is an on/off code using a positive voltage level such as three volts for a binary one and a near zero voltage level for a binary zero, over a transmission link, it is more efficient in terms of power to encode binary data with an equivalent difference in voltage levels but symmetrically balanced about zero volts. For example, in the ISDN, 2-binary, 1-quaternary (2B1Q) line codes are used which employ a four level, pulse amplitude modulation (PAM), nonredundant code. Each pair of binary bits of information to be transmitted is converted to a quaternary symbol (−3, −1, +1, and +3). For example, "00" is coded to a −3, "01" is coded to a −1, "10" is coded to a +3, and "11" is coded to a +1.

In digital communications environments like the ISDN, digital information is transmitted in accordance with a predetermined protocol or format. Using the ISDN as an example, quaternary, 2B1Q line code symbols are partitioned into frames with each frame containing certain fields of bits including typically at least a synchronization field and a data field. While the information in the data field changes frame-by-frame, the information in the synchronization field includes a specific, predetermined pattern of symbols used by a receiver to synchronize to the transmitter sending the message. For example, in U-transceivers specified for use in the ISDN, each U-frame consists of a field of 9 quaternary symbol pattern for synchronization and a field of 111 quaternary symbols for data totalling 120 symbols per frame. The nine quaternary symbols in the synchronization field are transmitted in the following pattern (+3, +3, −3, −3, −3, +3, −3, +3, +3).

Noticeably absent in the synchronization field are quaternary symbols having a magnitude of "1." Thus, unlike the symbol distribution in the data field where symbols −3, −1, +1, and +3 are distributed with equal probability, the synchronization field includes only symbols with a magnitude of "3". Accordingly, the probability ($P_3$) of receiving a symbol with a magnitude of "3" over each frame is $$P_3 = [(120-9)/2 + 9]/120 = 129/240 = 0.5375 \quad (1)$$

The probability $P_1$ that the symbol received has a magnitude of 1 is defined $$P_1 = [(120-9)/2]/120 = 111/240 = 0.4625 \quad (2)$$

Thus, there is a higher probability of receiving symbols with the magnitude of "3" for each frame.

While in theory, the receiver portion of the U-transceiver is looking for symbols which have amplitude values corresponding to magnitudes of 1 and 3, in reality, distortion on the transmission path, noise, and other factors mean that some of the received symbols have magnitudes different than "1" and others have a magnitude different than "3". Still, the probability ($P_1/2$) that the magnitude of a received signal is less than "1" is the same as the probability that the received signal is greater than "1", e.g., 0.9 and 1.1 are equally probable. Likewise, the probability ($P_3/2$) that the magnitude of a received signal is less than "3" or greater than "3" is the same, e.g., 3.1 and 2.9.

Adaptive gain control (AGC) is used to adaptively adjust the amplitude level of a received symbol so that its peak sampled amplitude and a corresponding symbol reference amplitude threshold are equal. This adjustment may be achieved either by adapting the gain in the receive path or by adapting the symbol reference thresholds. It is very important in high speed data communication systems such as the ISDN that the AGC operation be performed accurately so that symbols are properly detected/identified. Typically, the adaptive gain control (AGC) value applied to received symbols is incremented or decremented by some step amount/increment "μ" depending upon the detected symbol magnitude level:

$$AGC_{gain}(t) = AGC_{gain}(t-1) \pm \mu \quad (3)$$

An equivalent incremental change of the gain value can be implemented using $$AGC(t)_{gain} = AGC_{gain}(t-1)*(1\pm\mu) \quad (4)$$

The standard step size is used to adjust the gain either slightly up when the received symbol is less than a predetermined symbol reference magnitude, i.e., less than 1 in the 2B1Q line code example, or to slightly decrease the gain when the received signal magnitude is greater than the predetermined symbol Reference magnitude, i.e.,greater than 3 in the 2B1Q line code example. The gain value is neither increased nor decreased for received symbols with magnitudes between those symbol reference magnitudes, i.e., greater than 1 or less than 3 in the 2B1Q line code example.

In a steady state system, one could assume that since over time the same number of symbols with magnitude "1" would be received as symbols with magnitude "3", the gain adjustment step size "μ" could be a fixed value to increase or decrease the gain value. However, this assumption is not correct because predetermined symbol patterns in the communications protocol, i.e., the synchronization field in this ISDN example, cause with magnitude "3" to outweigh symbols with magnitude "1". As a result of this statistical unbalance favoring receipt of symbols with magnitude "3", the adaptive gain value is more likely to be decremented than incremented. In other words, the number of times the received symbol has a magnitude greater than "3" (which requires a decrement or decrease in gain) is larger than the number of times the received symbol has a magnitude less than "1" (which requires an increment or increase in gain) resulting in bias in gain estimate. Such an unbalance adversely affects symbol detection/identification as well as the signal-to-noise ratio of the received symbol and transceiver synchronization operations.

None of the conventional approaches for updating the AGC value, e.g., see equations (3) and (4), takes into account the statistics of the applied line code which often reveal a biased AGC value. Accordingly, there is a need for an improved AGC approach that compensates for non-symmetric, probabilistic distribution of symbols.

SUMMARY OF THE INVENTION

It is an object of the present invention to provide an adaptive gain control method and apparatus that accurately adjusts the adaptive gain control value applied to received symbols. It is a further object to provide an adaptive gain control method and apparatus that compensates for received symbol unbalance when adjusting gain to achieve an unbiased adaptive gain control value. It is a still further object to provide an improved AGC that compensates for non-symmetric, probabilistic distribution of symbols.

The present invention satisfies these and other objects as well as overcomes the shortcomings of other adaptive gain control techniques by taking advantage of a known symbol distribution, such as a digital signalling protocol, frame format, etc., to achieve an accurate, unbiased adjustment to an adaptive gain applied to received symbols. Thus, adaptive gain control updating in accordance with the present invention employs one or more different step sizes for incrementing and decrementing the value of the adaptive gain control value depending on the magnitude of the symbol received.

Initially, a probability of receiving each of a plurality of symbols to be transmitted over a data communications channel is determined for the predetermined communications protocol used over that data communications channel. Based on the probability determined for each symbol, a gain adjustment factor is established for one or more of those symbols. When communications commence, symbols transmitted over the data communications channel are detected, and a gain value is selectively adjusted using an adjustment factor established for the currently detected symbol.

If the communications system includes a set of symbols having two different magnitudes and assuming a first symbol magnitude has on associated probability greater than a probability of occurrence associated with a second symbol magnitude (based on the communications protocol), the adjustment factor established for the first symbol is smaller than the adjustment factor established for the second symbol. Thereafter, when a symbol is detected, its magnitude is determined, and the magnitude is compared to various symbol magnitude threshold levels. If the received symbol magnitude is within a predetermined threshold range, the current adaptive gain value is not adjusted. On the other hand, if the received symbol magnitude is outside of that predetermined range, the gain value is varied based on the adjustment factor determined specifically for that symbol's magnitude.

According to the present invention, the AGC gain value is varied using adjustment factors based on symbol magnitude receipt probabilities determined from the known distribution of plural symbols transmitted over the communications path. In this way, the present invention compensates for bias favoring one or more of the symbols thereby achieving more accurate and reliable symbol detection.

A better understanding of the features and advantages of the present invention will be obtained by reference to the following detailed description of the invention and the accompanying drawings which set forth example embodiments in which the principles of the present invention are utilized.

BRIEF DESCRIPTION OF THE DRAWINGS

FIG. 1 is a system level drawing showing an integrated services data network (ISDN) which is one example environment in which the present invention may be applied;

FIG. 2 is a functional block diagram of an example transceiver employing an adaptive gain controller in accordance with an example embodiment of the present invention;

DETAILED DESCRIPTION OF THE DRAWINGS

Figure 3:
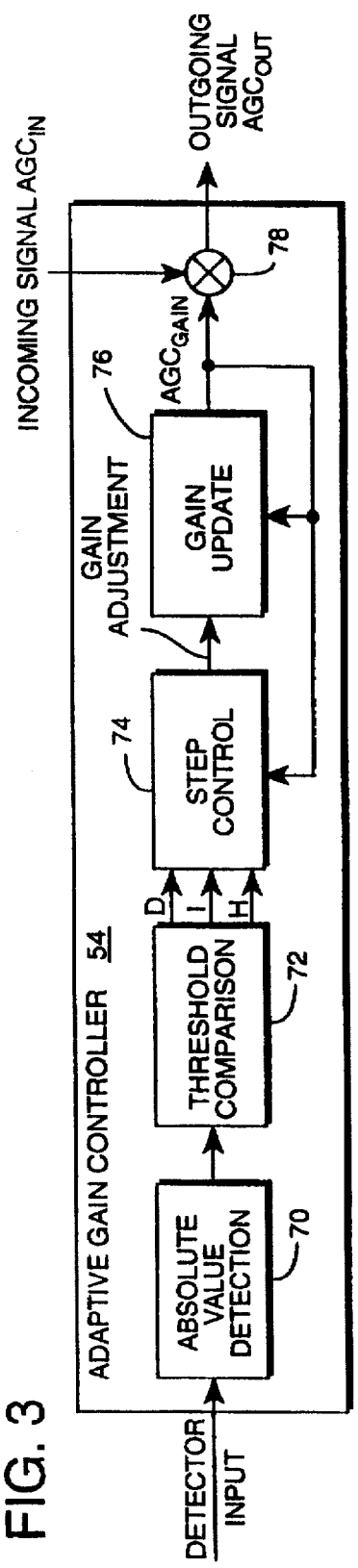
FIG. 3 is a function block diagram of an adaptive gain controller in accordance with an example embodiment of the present invention.

In the following description, for purposes of explanation and not limitation, specific details are set forth, such as particular circuits, interfaces, techniques, etc. in order to provide a thorough understanding of the present invention. However, it will be apparent to one skilled in the art that the present invention may be practiced in other embodiments that depart from these specific details. In other instances, detailed descriptions of well known methods, devices, and circuits are omitted so as not to obscure the description of the present invention with unnecessary detail.

FIG. 1 shows an overall block diagram of one data communications environment, i.e., the integrated services digital network (ISDN) 10, to which the present invention may be applied. A building 12 may for example include telephone subscribers (16 and 18) and data subscribers (personal computer 14) linked over a local area network to a U-transceiver 20 via an S-transceiver (not shown). The U-transceiver 20 is connected by a two-wire "loop" transmission line 22 to another U-transceiver 26 at telephone switching and services network 24 which provides digital switching and other messaging/call processing services. One of the important functions that must be performed by U-transceivers 20 and 26 is the accurate detection of symbols transmitted over transmission line 22 which in part depends on accurate and unbiased adjustment of the adaptive gain value applied to received symbols.

For purposes of illustration and description only, the present invention is described hereafter in the context of an ISDN network that uses U-transceivers, 2B1Q line codes, and the 120 symbol frame format (9 symbol sync field and 111 symbol data field) described above in the background section. However, as will be appreciated by those skilled in the art, the present invention may be applied to other types of data communications networks, other types of line codes/symbols, and other digital communication protocols.

A U-transceiver 40 is shown in function block form in FIG. 2 and includes a transmit data input port 42 connected to a coder 44 such as a 2B1Q coder for encoding the binary data pairs into a corresponding quaternary symbol. The output of coder 44 is connected to an echo canceler 52 and a transmit data output port 46. The transmitted symbols are connected to the transmission loop through a conventional hybrid 47. A receive data input port 48 receives symbols transmitted over the transmission loop as well as the echo of symbols transmitted from the transmit data output port 46 via the hybrid 47. The output from the receive data input port 48 is filtered in a receive filter 50 with the filtered signals being input to echo canceler 52. The receive filter 50 is designed to improve receiving conditions including "shortening the tail" of the received pulse waveform.

The just transmitted symbol sequence output from the coder 44 output is used to cancel echoes of the just transmitted symbol sequence mixed in with the received symbol sequence in a conventional echo canceler 52. The output of echo canceler 52 ($AGC_{in}$) is processed by adaptive gain controller 54. Adaptive gain controller 54 feeds an AGC output signal ($AGC_{out}$) to filter 56. After appropriately adjusting the gain, the AGC output signal represents (at least in theory) the symbol amplitude adjusted to a desired magnitude value appropriate for a subsequently received symbol. Filter 56 essentially suppresses the "precursor"

portion of the received, gain adjusted pulse as will be appreciated by those skilled in the art. The output of filter 56 is combined in a difference 58 with the output of an equalizer 66. Equalizer 66 essentially models the "post cursor tail" of the received symbol. As a result, the difference output is essentially the received symbol which is then identified by detector 60 (as a +1, −1, +3, or −3) as well as feedback to adaptive gain controller 54. The detected symbol is decoded in decoder 62 into binary bits and transmitted to a receive data output port 64.

The detailed timing and operation of U-type (and other) transceivers are generally known and are not necessary for an understanding of the present invention which relates to accurate adaptive gain control (AGC) and applications that use AGC. Therefore, the following description focuses on the operation of adaptive gain controller 54. However, from the general description of transceiver 40 provided above, one skilled in the art can readily appreciate that the adaptive gain controller 54 output $AGC_{gain}$ affects significantly symbol detection and transceiver synchronization operations. Clearly, accurate and unbiased AGC adjustment is an important part of successful high speed data communications. Those skilled in the art will also appreciate that the AGC 54 may be located in other sections of the transceiver including for instance in an analog front end to improve the dynamic range of an analog to digital converter. The AGC 54 may also be embodied in a digital signal processor.

FIG. 3 is function block diagram of the adaptive gain controller 54 of transceiver 40 that may be used in implementing the present invention. The filtered (in precursor filter 56) and equalized (in equalizer 66) received symbol ready for identification/detection by detector 60 is also fedback to an absolute value detection element 70 in adaptive gain controller 54 to determine the magnitude of the symbol. Again, a 2B1Q line code is assumed including symbols corresponding to +1, −1, +3, −3. The magnitude of the detected symbol is compared to "1" and "3" thresholds in a threshold comparison unit 72. The symbol magnitude is compared to determine whether or not it is (1) less than 1, (2) greater than 3, or (3) greater than or equal to 1 and less than or equal to 3. If the symbol magnitude is greater than or equal to 1 and less than or equal to 3, the threshold comparison unit 72 outputs a hold signal (H) which means that the adaptive gain control value is neither increased nor decreased. If the symbol magnitude is less than 1 (the gain needs to be increased to bring the symbol magnitude up to the desired symbol 1 magnitude recognized by the symbol detector), the threshold comparison unit 72 outputs an increase signal (I). Finally, if the symbol magnitude is greater than 3 (the gain needs to be decreased to bring the symbol magnitude down to the desired symbol 3 magnitude recognized by the symbol detector), threshold comparison element 72 outputs a decrease signal (D).

Depending upon which of the threshold comparison signals received H, I, or D, step control unit 74 generates an appropriate gain adjustment to gain update unit 76 which outputs an $AGC_{gain}$ signal to multiplier 78. The AGC adjustment factor is used to adjust, if necessary, the current gain value $AGC_{gain}$ applied to received symbols. The output $AGC_{out}$ signal is the received symbol with its amplitude/magnitude adjusted to a standard symbol magnitude.

In the example embodiment shown in FIG. 3, the gain adjustment signal (i.e., the $AGC_{gain}$ signal) is in the form of ±µ*$AGC_{gain}$ in accordance with the AGC gain adjustment equation (4) described above. Of course, the adjustment factor could also be simply (±µ) if the factor is to be added to the current AGC value in accordance with equation (3).

The $AGC_{gain}$ signal is also fed back to the gain update unit 76 as well as to the step control unit 74. The $AGC_{gain}$ value is multiplied in multiplier 78 with an input signal $AGC_{in}$ to provide an $AGC_{out}$ signal.

Step control circuit 74 maintains different step size values, e.g., µ values, for each of the symbol magnitudes. In our example case adopting a 2B1Q line code and a standard ISDN data communications protocol, each U-frame includes a pattern of nine symbols used for synchronization all of which have a magnitude of three. Thus, the synchronization frame favors symbols with the magnitude of 3. The 111 data symbols which make up the rest of the 120 symbol U-frame have a symmetric probability distribution, i.e., the symbol distribution for these remaining 111 symbols in the frame is −3, −1, +1, and +3, with equal probability. On the whole then, and as described in detail in the Background section, the probability of receiving symbols with magnitude 3 is equal to $P_3=0.5375$ and symbols with magnitude 1 is equal to $P_1=0.4625$.

Despite this non-symmetrical probability distribution, the symbol level may be properly adjusted if adjustment of the $AGC_{gain}$ value reflects the probability of receiving the symbol with a respective magnitude. Since most AGC systems adjust the $AGC_{gain}$ value using a fixed incremental step value or size µ, the present invention is described hereafter in terms of adjusting the step size. The step size for decreasing the gain, i.e., when the gain is adjusted for a symbol magnitude greater than 3, is smaller than the step size for increasing the gain, i.e., when the gain is adjusted for a symbol magnitude less than 1. Recall that the gain is not adjusted when the symbol magnitude is less or equal to 3 and greater than or equal to 1. The different step sizes compensate for the statistics favoring decreasing the AGC value since there is a greater probability of receiving a symbol with magnitude 3 than a symbol with magnitude 1.

There are a number of different techniques for implementing these two different step sizes (gain adjustment factors) to adjust the $AGC_{gain}$ value without bias. For example, the output signals (D, I, H) of the threshold comparison unit 72 may be used by the step control unit 74 to select the appropriate gain step size µ previously determined for each symbol magnitude based on the known signal distribution/protocol used in the data transmission system, i.e., step sizes for decreasing ($µ_{decrease}$) and increasing ($µ_{increase}$) the current gain value. Then, based on the threshold output comparison, the step controller 74 generates the appropriate "Gain Adjustment" signal in accordance with the following:

$$\text{Gain Adjustment} = AGC_{t-1} * µ_s \qquad (5)$$

where $µ_s$ is an adjustment factor corresponding to the detected symbol and varies depending on the detected symbol.

Figure 4:
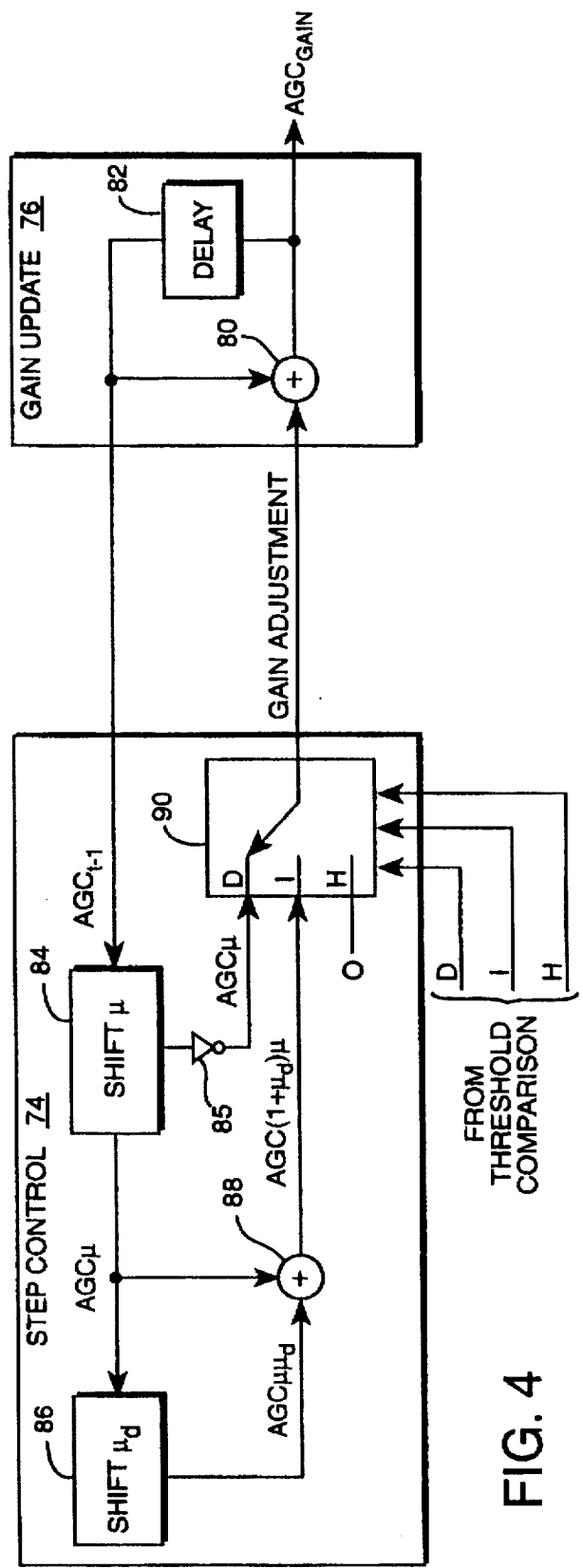
FIG. 4 is a function block diagram relating specifically to step control and gain update elements of the adaptive gain controller illustrated in FIG. 3.

In FIG. 4, which shows one example implementation of step control 74 and gain update 76, gain update 76 includes a delay 82 which generates $AGC_{t-1}$ to be added with the gain Adjustment signal from the step control 74. Thus, the gain value $AGC_{gain}$ at the output of summer 80 is adjusted in accordance with the following equation (similar to equation (4) above):

$$AGC_{gain} = \text{Gain Adjustment} + AGC_{t-1} \qquad (6)$$

In equation (6), contrary to standard equation (4), the step size is not fixed but is instead variable and determined in advance in accordance with the known signal distribution of the communications protocol as already described above. For example, if $AGC_{gain}$ is to be decreased, one step size is selected in selector 90 depending on the threshold comparison output 72, and if $AGC_{gain}$ is to be increased, another step size is selected by selector 90.

Preferably (although not necessarily), the present invention is implemented using digital signal processing techniques. It is desirable in digital signal processing contexts to minimize data processing resources by avoiding high overhead multiplication operations, and instead, to use, if possible, adding/subtracting/shifting operations. The calculation of equation (5) requires a multiplication operation every time the gain is updated/adjusted. Therefore, in the preferred example embodiment shown in FIG. 4, the present invention uses (although does not require) an advantageous technique for generating the appropriate step size adjustment factor for adjusting the AGC value that reflects the probability of receiving the symbol with the respective magnitude without requiring a multiplication operation.

A ratio between the step size $\mu_{increase}$ associated with received symbol magnitudes less than 1 and the step size $\mu_{decrease}$ associated with received symbol magnitudes greater than 3 reflects the probability of receiving the symbol with a respective magnitude as follows:

$$\mu_{increase}/\mu_{decrease} = \frac{P_3/2}{P_1/2} = 1.162 \tag{7}$$

Of course, such probability ratios may readily be defined for other types of codes and protocols as well.

Mathematically, $\mu_{decrease}$ can be represented as incrementing a fixed or standard step size $\mu$ modified by an exponential factor of 2 such as $$\mu_{increase} = (\mu + \mu 2^{-i}) = \mu(1 + 2^{-i}) \tag{8}$$

where $\mu$ is a fixed gain adjustment step size (as is used in conventional AGCs). Similarly, $\mu_{decrease}$ can be represented as a standard step size being decremented by some exponential factor of 2:

$$\mu_{decrease} = (\mu - \mu 2^{-j}) = \mu(1 - 2^{-j}) \tag{9}$$

Table 1 (below) illustrates how the ratio $$\mu_{increase}/\mu_{decrease} = (1 + 2^{-i})/(1 - 2^{-j}) = 1.162 \tag{10}$$

for 2B1Q line codes can be approximated by selecting appropriate values of exponents i and j.

TABLE 1

|       | j = 2  | j = 3  | j = 4  | j = 5  | j = 6  | ... | j = ∞  |
|-------|--------|--------|--------|--------|--------|-----|--------|
| i = 2 | 1.6667 | 1.4286 | 1.3333 | 1.2903 | 1.2698 | ... | 1.25   |
| i = 3 | 1.5000 | 1.2857 | 1.2000 | 1.1613 | 1.1429 | ... | 1.125  |
| i = 4 | 1.4167 | 1.2143 | 1.1333 | 1.0968 | 1.0794 | ... | 1.0625 |
| i = 5 | 1.3750 | 1.1786 | 1.1000 | 1.0645 | 1.0476 | ... | 1.0313 |
| i = 6 | 1.3542 | 1.1607 | 1.0833 | 1.0484 | 1.0317 | ... | 1.0156 |
| ...   | ...    | ...    | ...    | ...    | ...    | ... | ...    |
| i = ∞ | 1.3333 | 1.1429 | 1.0667 | 1.0323 | 1.0159 | ... | 1.0    |

By representing in a binary context the ratio of $\mu_{increase}$ and $\mu_{decrease}$ as $(1+2^{-i})/(1-2^{-j})$, multiplication in equation (5) can be replaced with a shift and an add which conserves data processing resources. The embodiment in FIG. 4 uses only shift and add operations. As an example, assume the AGC gain is to be multiplied by an adjustment of $\mu = 2^{-14}$. This multiplication operation corresponds in a binary digital processing environment to shifting the current gain 14 binary bit positions. Similarly, $\mu_{increase} = 2^{-14} + 2^{-17}$ (where $2^{-17}$ is the step size adjustment factor) corresponds to two shifts and one addition. First, the gain (or other number which would otherwise have been multiplied by $\mu$ a increase) is shifted by fourteen binary bit positions and then added to the gain shifted an additional three binary positions. Mathematically, this is equivalent to $$\mu_{increase} = 2^{-14} + 2^{-17} = 2^{-14}(1 = 2^{-3}) \tag{11}$$

which corresponds to shifting the gain (or other multiplied number) 3 binary positions, (e.g., shift $\mu_d$ block 86 in step control 74 in a FIG. 4 which generates an output $AGC\mu\mu_d$), adding it to itself, and shifting the result 14 binary positions. This latter operation is useful to determine the values of $\mu_{increase}$ and $\mu_{decrease}$. Namely, if $$\mu_{increase} = 2^{-14} + 2^{-17} = 2^{-14}(1 + 2^{-3}) \tag{12}$$

$$\mu_{decrease} = 2^{-14} - 2^{-17} = 2^{-14}(1 - 2^{-3}) \tag{13}$$

adjusting the AGC value requires only shift and add operations.

By calculating the ratio of step sizes, a best choice of exponents i and j can be made. As shown below in equation (12), selecting both i and j as 3 is not quite close enough to 1.162.

$$\frac{\mu_{increase}}{\mu_{decrease}} = \frac{2^{-14}(1 + 2^{-3})}{2^{-14}(1 - 2^{-3})} = \frac{(1 + 2^{-3})}{(1 - 2^{-3})} = 1.2857143$$

If i and j are chosen to both be 4, $$\frac{\mu_{increase}}{\mu_{decrease}} = \frac{2^{-14} + 2^{-18}}{2^{-14} - 2^{-18}} = \frac{2^{-14}(1 + 2^{-4})}{2^{-14}(1 - 2^{-4})}$$

the ratio of the step sizes for incrementing and decrementing AGC value is equal to $$\frac{\mu_{increase}}{\mu_{decrease}} = \frac{2^{-14}(1 + 2^{-4})}{2^{-14}(1 - 2^{-4})} = \frac{(1 + 2^{-4})}{(1 - 2^{-4})} = 1.13333$$

While 1.13333 differs slightly from the required value of 1.162, it may be close enough for some practical applications to prevent bias in gain adjustment while eliminating multiplication operations. This selection of i and j is particularly appealing because the gain correction term does not depend on whether the AGC value is incremented or decremented with the correction term in both cases equalling $\mu*AGC*2^{-4}$. From Table 1 above, however, the ratio $(1+2^{-3})/(1-2^{-5})$ of 1.1613 most closely approximates the 2B1Q line code probability ratio. In the AGC implementation shown in FIG. 4, the AGC adjustment is only to be corrected for incrementing, and, decrementing occurs using the standard step size $\mu$. Therefore, for decrementing, the output from shift $\mu$ block 84 is inverted by inverter 85 to generate a negative value which, when selected by selector 90, is effectively subtracted from the previous value $AGC_{t-1}$ in summer 80. For incrementing, the output from shift $\mu$ block 84 is sifted by $\mu_{decrease}$ (shown as $\mu_d$ in FIG. 4) block 86, the output $AGC_{\mu\mu d}$ being added in summer 88 to $AGC_{\mu}$ to generate the larger magnitude incrementing adjustment $AGC(1+\mu_d)\mu$ selected by selector 90. Similarly, the AGC adjustment may only be corrected for decrementing, with the standard step size $\mu$ used for incrementing.

As discussed in the background, the problem of properly adjusting signal level in the receiving path of a digital communications system is very important because the thresholds necessary for deciding a symbol value are permanently set. The present invention provides a novel AGC updating technique which exploits the known symbol distribution of the digital communications protocol to achieve unbiased $AGC_{gain}$. In general, different step sizes/ adjustment factors are determined for increasing and decreasing the AGC value. In a symbol set that uses two symbol magnitudes like the 2B1Q line code, the ratio of the step sizes approximates the ratio of probabilities that the magnitude of the received symbol is a particular magnitude, e.g., a 1 or a 3. The detailed example implementation described above in conjunction with Table 1 provides a practical implementation which uses a binary approximation of the probability ratio requiring only a small number of low power digital processing computations. This latter feature is particularly advantageous because it can be used with transceivers in high speed data communications systems that are manufactured using lower cost, lower power VLSI circuitry, where the cost and power are in part a function of the number computations to update the AGC value.

While the invention has been described in connection with what is presently considered to be the most practical and preferred embodiment, it is to be understood that the invention is not to be limited to the disclosed embodiment, but on the contrary, is intended to cover various modifications and equivalent arrangements included so within the spirit and scope of the appended claims. For example, the present invention is not limited to the example described above using U-transceivers, 2B1Q line codes, and ISDN protocol formats. Rather the present invention may be applied to any known communications protocol to determine and compensate AGC adjustment for any type of symbol bias in any digital communications environment. Although the present invention was described in the context of adaptive gain control, it is equally applicable to adaptive reference control (ARC) techniques where instead of adapting the gain, the decision thresholds are adapted.

What is claimed is:

1. A method of automatically controlling a gain applied to detected symbols in a digital communications system, comprising the steps of:
   (a) comparing a magnitude of a received symbol with a threshold; and
   (b) based on the comparing step (a), automatically varying the gain based on a known distribution of the plural symbols.

2. The method in claim 1, wherein the known distribution is based on a probability of each symbol being received.

3. The method in claim 1, wherein the known distribution is based on a probability of each symbol being received for a given communications protocol.

4. The method in claim 1, wherein step (b) further includes incrementing the gain using a first step size associated with a first probability of gain increase or gain decrease and decrementing the gain using a second different step size associated with a second probability of gain increase or gain decrease.

5. The method in claim 4, wherein a difference in the first and second step sizes compensates for varying the gain in favor of one of the first and second symbols due to the known distribution of the plural symbols.

6. The method in claim 4, wherein a first symbol having a first magnitude is statistically determined as less likely to be detected than a second symbol having a second magnitude, and as a result of the statistical determination, the first step size is greater than the second step size.

7. The method in claim 1, wherein step (b) further includes increasing the gain using a first adjustment value associated with a first probability of increasing or decreasing the gain and decreasing the gain using a second different adjustment value associated with a second probability of increasing or decreasing the gain.

8. The method in claim 7, wherein selective application of the first and second adjustment values compensates for varying the gain in favor of one of the first and second symbols due to the known distribution of the plural symbols.

9. The method in claim 7, wherein a first symbol having a first magnitude is statistically determined as less likely to be detected than a second symbol having a second magnitude, and as a result of the statistical determination, the first adjustment value is greater than the second adjustment value.

10. The method in claim 1, wherein step (a) comprises the steps of:
    determining whether a magnitude of a received symbol is within a predetermined range;
    if the received symbol magnitude is within the predetermined range, maintaining the gain at a current gain value; and
    if the received symbol magnitude is outside of the predetermined range, performing step (b).

11. In a data communications system including a receiver for receiving plural symbols transmitted over a data communications channel, a method of operating the receiver comprising the steps of:
    determining for a predetermined communications protocol, a probability of receiving each symbol;
    establishing an adjustment factor corresponding to each of the symbols based on the probability associated with each symbol;
    detecting a symbol transmitted over the data communications channel; and
    selectively adjusting a gain value applied to received symbols to adjust symbol values using the adjustment factor established for the detected symbol.

12. The method in claim 11, wherein a first symbol has an associated probability greater than an associated probability for a second symbol, and wherein the adjustment factor established for the first symbol is smaller that the adjustment factor established for the second symbol.

13. The method in claim 11, wherein the detecting step further comprises the steps of:
    determining a magnitude of the detected symbol, and
    comparing the determined symbol magnitude to one or more thresholds to determine whether the gain value should be adjusted, and if so, whether to increase or decrease the gain value.

14. The method in claim 11, wherein the gain value is adjusted in accordance with the following:

$$AGC_{gain}(t) = AGC_{gain}(t-1)(1+\mu_s)$$

where $AGC_{gain}(t)$ is the gain value to be applied to the detected symbol, $AGC_{gain}(t-1)$ is a previously applied gain value, and $\mu_s$ is an adjustment factor corresponding to the detected symbol and varies depending on the detected symbol.

15. The method in claim 11, further comprising:
    representing the gain value as a binary number, wherein the gain value is adjusted by shifting the binary number gain value by a number of bit shifts corresponding to at least one adjustment factor.

16. The method in claim 15, further comprising:
    approximating a number of bit shifts for each symbol using a predetermined relationship of the symbol probabilities.

17. The method according to claim 16, wherein the relationship is the ratio of a probability μ1 of receiving the first symbol for increasing the gain value over a probability μ2 of receiving the second symbol for decreasing the gain value, the ratio of μ1/μ2 being approximated by $(1+2^{-i})/(1-2^{-j})$, i and j being integers.

18. In a digital data communications system including a transceiver that transceives symbols transmitted over a communications channel, a method comprising the steps of:
    determining for a predetermined digital communications protocol where a first symbol or series of symbols is predictably received more frequently than a second symbol or series of symbols, an error in adjusting a gain value applied to received first and second symbols;
    determining a variable adjustment factor that compensates for the error; and
    adjusting a gain applied to received symbols using the variable adjustment factor.

19. The method in claim 18, wherein the digital communications protocol is a framed protocol with at least some frames having at least one field which includes a greater number of the first symbol or series of symbols than the second symbol or series of symbols such that there is a greater probability of receiving the first symbol or series of symbols.

20. The method in claim 18, wherein a first adjustment factor corresponding to the first symbol or series of symbols is smaller than a second adjustment factor corresponding to the second symbol or series of symbols.

21. A digital communications system including plural transceivers for transceiving digital signals having first and second amplitudes over a communications path, each transceiver including an adaptive gain controller for applying an adaptive gain control factor to a plurality of received signals, said adaptive gain controller automatically varying the adaptive gain control factor based on a predetermined first probability of increasing or decreasing the adaptive gain control factor and a predetermined second probability of increasing or decreasing the adaptive gain control factor.

22. The adaptive gain controller in claim 21, wherein the adaptive gain control factor is determined in accordance with a ratio of the first and second predetermined probabilities.

23. The adaptive gain controller in claim 21, wherein the first probability is greater than the second probability and a corresponding first adaptive gain control factor is less than a corresponding second factor.

24. An adaptive gain controller, comprising:
    a symbol processor, and
    a gain adjuster receiving information from the symbol processor and selectively adjusting a gain applied to symbols received by the symbol processor, wherein the gain adjuster compensates for an error in adjusting the gain that would occur when there is a higher probability of receiving one symbol over another symbol.

25. An adaptive gain controller for selectively adjusting a gain applied to symbols having different magnitudes received by the adaptive gain controller, comprising:
    an absolute value detector for determining a magnitude of a received symbol;
    a comparator for performing a threshold comparison on the symbol magnitude to determine whether to maintain the gain at a current value, increase the gain by a first amount, or decrease the gain by a second different amount, the first and second amounts being determined based on a known distribution of the plural symbols; and
    a controller receiving an output from the comparator, and in response thereto, selectively maintaining the gain at the current value, increasing the gain by the first amount, or decreasing the gain by the second different amount.

26. The adaptive gain controller according to claim 25, wherein gain is represented in binary format and the controller includes:
    a first shift register for shifting the binary gain value a s predetermined number of shift positions corresponding to the second amount to produce a first shifted signal;
    a second shift register for shifting the first shifted signal by another predetermined number of shift positions corresponding to the first amount to produce a second shifted signal; and
    a multiplexer having three inputs receiving the first shifted signal, the second shifted signal, and a null input, wherein one of the three inputs is selected in accordance with the output from the comparator.

27. The adaptive gain controller according to claim 25, wherein the first and second amounts are determined based on a probability of each symbol being received during a predetermined time period.

28. The adaptive gain controller according to claim 25, wherein the first and second amounts are determined based on a probability of each symbol being received for a given communications protocol.

29. The adaptive gain controller according to claim 25, wherein the first and second amount values compensate for a bias in varying the gain in favor of one of the first and second symbols due to the known distribution of the plural symbols.

30. An adaptive gain control for automatically controlling a gain applied to detected symbols in a digital communications system, comprising:
    means for determining whether a magnitude of a received symbol is within a predetermined range;
    means for maintaining the gain at a current gain value if the received symbol magnitude is within the predetermined range; and
    means for automatically varying the gain based on a known distribution of the plural symbols if the received symbol magnitude is outside of the predetermined range.

* * * * *